(12) United States Patent
Suganuma

(10) Patent No.: US 11,257,813 B2
(45) Date of Patent: Feb. 22, 2022

(54) SEMICONDUCTOR DEVICE

(71) Applicant: ROHM Co., Ltd., Kyoto (JP)

(72) Inventor: Kenta Suganuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/884,167

(22) Filed: May 27, 2020

(65) Prior Publication Data
US 2020/0381421 A1 Dec. 3, 2020

(30) Foreign Application Priority Data

May 28, 2019 (JP) .............................. JP2019-099505

(51) Int. Cl.
| | |
|---|---|
| H01L 27/06 | (2006.01) |
| H02M 1/34 | (2007.01) |
| H01L 49/02 | (2006.01) |
| H01L 23/522 | (2006.01) |

(52) U.S. Cl.
CPC ...... *H01L 27/0629* (2013.01); *H01L 23/5223* (2013.01); *H01L 28/60* (2013.01); *H02M 1/34* (2013.01); *H02M 1/346* (2021.05)

(58) Field of Classification Search
None
See application file for complete search history.

(56) References Cited

U.S. PATENT DOCUMENTS

| | | | | |
|---|---|---|---|---|
| 10,546,917 | B1 * | 1/2020 | Tsai | H01L 21/308 |
| 2002/0036310 | A1 * | 3/2002 | Lutzen | H01L 27/1087 |
| | | | | 257/301 |
| 2009/0242977 | A1 * | 10/2009 | Kawaguchi | H01L 29/66666 |
| | | | | 257/330 |
| 2016/0240640 | A1 * | 8/2016 | Nakamura | H01L 29/1095 |
| 2016/0260703 | A1 * | 9/2016 | Nakamura | H01L 29/407 |
| 2018/0366537 | A1 * | 12/2018 | Liu | H01L 21/76879 |

FOREIGN PATENT DOCUMENTS

JP 2014-116631 A 6/2014

\* cited by examiner

*Primary Examiner* — Zandra V Smith
*Assistant Examiner* — Lawrence C Tynes, Jr.
(74) *Attorney, Agent, or Firm* — Hamre, Schumann, Mueller & Larson, P.C.

(57) ABSTRACT

A semiconductor device includes: semiconductor layer having surface and rear surface; insulating film formed on the surface; first and second surface electrode layers formed on the insulating film; rear electrode layer formed on the rear surface; active region set in region of the surface covered with the first surface electrode layer; capacitor region set in region of the surface covered with the second surface electrode layer; first trench formed in the active region; first insulating film formed on inner surface of the first trench; first embedded electrode embedded in the first trench and controlling ON/OFF of current flowing between the first surface electrode layer and the rear electrode layer; second trench formed in the capacitor region; second insulating film formed on inner surface of the second trench; and second embedded electrode embedded in the second trench and electrically connected to the first surface electrode layer.

8 Claims, 17 Drawing Sheets

SEMICONDUCTOR DEVICE

CROSS-REFERENCE TO RELATED APPLICATION

This application is based upon and claims the benefit of priority from Japanese Patent Application No. 2019-099505, filed on May 28, 2019, the entire contents of which are incorporated herein by reference.

TECHNICAL FIELD

The present disclosure relates to a semiconductor device.

BACKGROUND

For example, a DC/DC converter and other high-speed switching operation circuits include a switching element for switching a power source voltage at a high speed. A metal-oxide-semiconductor field-effect-transistor (MOSFET) having an active layer formed of a silicon semiconductor is applied to the switching element.

In such a circuit, a source-drain voltage of the switching element may rise suddenly at the time of turn-off due to parasitic inductance in the circuit and cause a large loss. This kind of loss can be reduced by installing a capacitor (snubber circuit) between the source and the drain.

In a related art, as a semiconductor device mounted with a snubber circuit, disclosed is a semiconductor device, which includes: a semiconductor substrate of a first conductivity type; a semiconductor layer of a second conductivity type installed on a part of the semiconductor substrate; a plurality of first electrodes installed in the semiconductor layer via a gate insulating film; a second electrode separated from the semiconductor layer and installed in the semiconductor substrate via a capacitance insulating film; and a source electrode installed on the semiconductor substrate, brought into contact with the semiconductor layer between the plurality of first electrodes and between the first electrodes and the second electrode, and electrically connected to the second electrode.

In the semiconductor device of the related art, a capacitor constituting the snubber circuit is arranged in a region on the side of a gate pad. Therefore, the region for the capacitor must be provided at the expense of a portion of a MOSFET region, which may reduce an allowable amount of current of the MOSFET region.

SUMMARY

Some embodiments of the present disclosure provide a semiconductor device capable of suppressing a reduction in an allowable amount of current flowing in an active region and suppressing generation of noise at the time of turn-off, compared with the related art.

According to one embodiment of the present disclosure, there is provided a semiconductor device, which includes: a semiconductor layer having a surface and a rear surface; an insulating film formed on the surface of the semiconductor layer; a first surface electrode layer and a second surface electrode layer formed on the insulating film and arranged at an interval from each other; a rear electrode layer formed on the rear surface of the semiconductor layer; an active region set in a region of the surface of the semiconductor layer covered with the first surface electrode layer; a capacitor region set in a region of the surface of the semiconductor layer covered with the second surface electrode layer; at least one first trench formed in the active region; a first insulating film formed on an inner surface of the at least one first trench; a first embedded electrode embedded in the at least one first trench and configured to control ON and OFF of current flowing between the first surface electrode layer and the rear electrode layer; at least one second trench formed in the capacitor region; a second insulating film formed on an inner surface of the at least one second trench; and a second embedded electrode embedded in the at least one second trench and electrically connected to the first surface electrode layer.

With this configuration, it is not necessary to sacrifice the active region for securing the capacitor region by effectively utilizing a region covered with the second surface electrode layer as the capacitor region. As a result, since the active region can be widely used, it is possible to suppress a reduction in allowable amount of current flowing in the active region.

Furthermore, a capacitor constituted by the second embedded electrode and a portion of the semiconductor layer facing each other with the second insulating film interposed therebetween is formed in the capacitor region. This capacitor is connected in parallel to a current path between the first surface electrode layer and the rear electrode layer. Thus, it is possible to suppress generation of noise when the current path between the first surface electrode layer and the rear electrode layer is turned off.

In some embodiments, wherein the at least one first trench includes a plurality of first trenches, and the at least one second trench includes a plurality of second trenches, wherein the plurality of first trenches are arranged in a stripe shape at intervals from each other, and wherein the plurality of second trenches are arranged in a stripe shape extending in a direction intersecting a stripe direction of the first trenches at intervals from each other.

With this configuration, it is possible to suppress warpage of the wafer when manufacturing an element structure of the semiconductor device according to an embodiment of the present disclosure on the semiconductor wafer. For example, when the first trenches and the second trenches have a stripe shape extending in the same direction as each other, the wafer is likely to be warped when the insulating film extending over the entire surface of the semiconductor wafer (for example, the insulating film on the surface of the semiconductor layer) is formed.

In some embodiments, the stripe direction of the first trenches and a stripe direction of the second trenches are orthogonal to each other.

In some embodiments, each of the first trenches has a width larger than a width of each of the second trenches.

In some embodiments, a pitch $P_1$ of the plurality of first trenches is larger than a pitch $P_2$ of the plurality of second trenches.

In some embodiments, the second insulating film includes a first portion formed on a side portion of the at least one second trench and a second portion formed on a bottom portion of the at least one second trench, and the second portion of the second insulating film has a thickness smaller than a thickness of the first portion of the second insulating film.

With this configuration, since the distance between the second embedded electrode and a portion of the semiconductor layer facing each other with the second insulating film (second portion) interposed therebetween can be reduced, it is possible to increase capacity of the capacitor.

In some embodiments, the semiconductor layer includes a source region of a first conductivity type, a channel region of a second conductivity type and a drift region of the first conductivity type sequentially formed along the at least one first trench in a direction from the surface to the rear surface of the semiconductor layer, the first embedded electrode includes a gate electrode, the first surface electrode layer includes a source electrode electrically connected to the source region and the channel region via the insulating film, the second surface electrode layer includes a gate pad electrically connected to the gate electrode, and the rear electrode layer includes a drain electrode electrically connected to the drift region.

In some embodiments, wherein the semiconductor layer includes an emitter region of a first conductive type, a base region of a second conductive type, a drift region of the first conductivity type sequentially formed along the at least one first trench in a direction from the surface to the rear surface of the semiconductor layer and a collector region of the second conductivity type arranged on the rear surface side of the semiconductor layer with respect to the drift region, the first embedded electrode includes a gate electrode, the first surface electrode layer includes an emitter electrode electrically connected to the emitter region and the base region via the insulating film, the second surface electrode layer includes a gate pad electrically connected to the gate electrode, and the rear electrode layer includes a collector electrode electrically connected to the collector region.

In some embodiments, the semiconductor device further includes a first conductivity type region formed on a bottom portion of the at least one second trench and having an impurity concentration higher than an impurity concentration of the drift region.

With this configuration, since the distance between the second embedded electrode and the first conductivity type region is reduced, it is possible to increase capacity of the capacitor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will now be described in detail with reference to the drawings.

Figure 1:
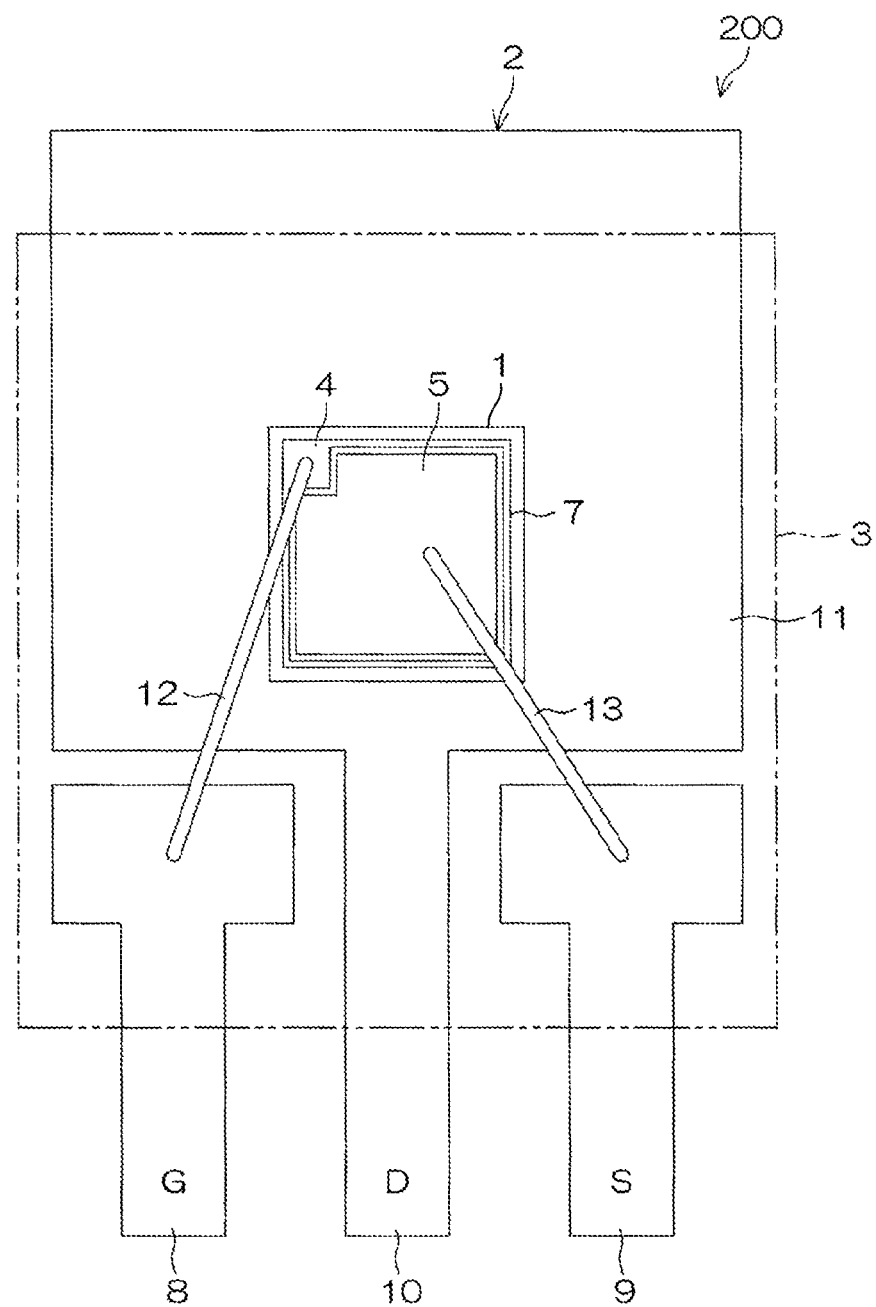
FIG. 1 is an external view of a semiconductor package including a semiconductor device according to an embodiment of the present disclosure.

FIG. 1 is an external view of a semiconductor package 200 including a semiconductor device 1 according to an embodiment of the present disclosure.

The semiconductor package 200 includes the semiconductor device 1, a lead frame 2, and a mold resin 3 (indicated by a two-dot chain line in FIG. 1).

The semiconductor device 1 includes a gate electrode (gate pad) 4 as an example of a second surface electrode layer of the present disclosure and a source electrode (source pad) 5 as an example of a first surface electrode layer of the present disclosure on one surface, and a drain electrode 6 (see FIGS. 3A and 3B) as an example of a rear electrode layer of the present disclosure on the other surface. A gate finger 7 surrounding the source electrode 5 is integrally connected to the gate electrode 4.

The lead frame 2 includes a gate lead 8 constituting a gate terminal, a source lead 9 constituting a source terminal, and a drain lead 10 constituting a drain terminal. In the present embodiment, the gate lead 8, the source lead 9, and the drain lead 10 are formed of plate-like bodies arranged so as to be located on the same plane, and the drain lead 10 is arranged between the gate lead 8 and the source lead 9. A chip support part (island) 11 configured to support the semiconductor device 1 is formed integrally with the drain lead 10.

The semiconductor device 1 is mounted (die-bonded) on the chip support part 11 by a so-called face-up method with the drain electrode 6 facing the chip support part 11. Therefore, the drain electrode 6 is electrically connected to the drain lead 10. The gate electrode 4 and the source electrode 5 are electrically connected to the gate lead 8 and the source lead 9, respectively, by wire bonding. More specifically, one end of a gate wire 12 is connected to the gate electrode 4 and the other end of the gate wire 12 is connected to the gate lead 8. Similarly, one end of a source wire 13 is connected to the source electrode 5 and the other end of the source wire 13 is connected to the source lead 9. In the present embodiment, the semiconductor device 1 is formed in a substantially rectangular shape in a plan view.

Furthermore, the gate electrode 4 is formed near one corner on one surface of the rectangular semiconductor device 1. In addition, the source electrode 5 is formed so as to cover other regions, and has a recess corresponding to the gate electrode 4 near the corner.

The mold resin 3 is formed so as to cover the semiconductor device 1, the gate wire 12, the source wire 13, and respective root parts of the gate lead 8, the source lead 9, and the drain lead 10. One surface of the chip support part 11 is a chip mounting surface on which the semiconductor device 1 is mounted and sealed with the mold resin 3. The other surface of the chip support part 11 may be a heat radiation surface exposed from the mold resin 3. Furthermore, the chip support part 11 may protrude from mold resin 3 at an opposite end of the source lead 9.

Figure 2:
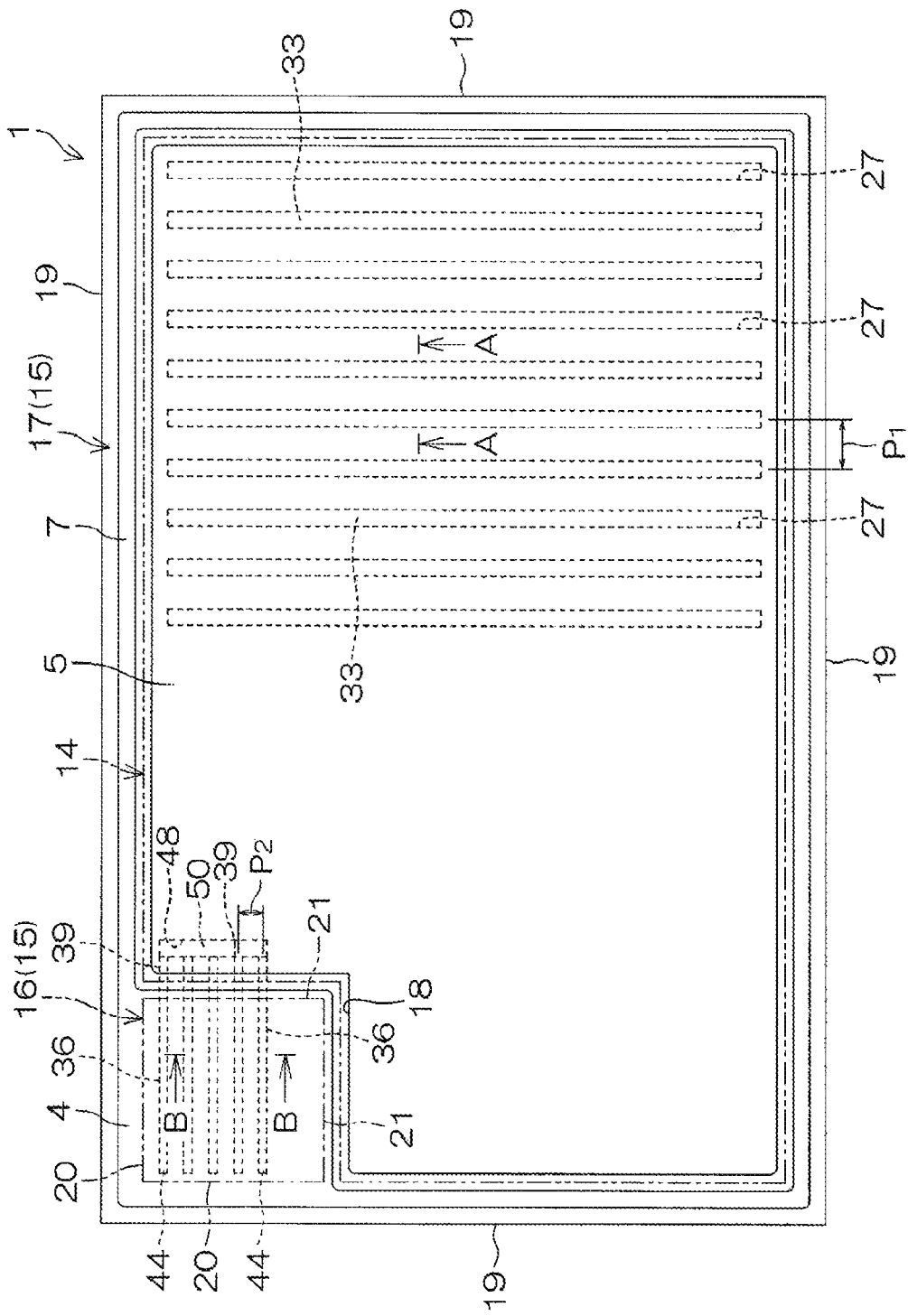
FIG. 2 is a schematic plan view of the semiconductor device.
Figure 3A:
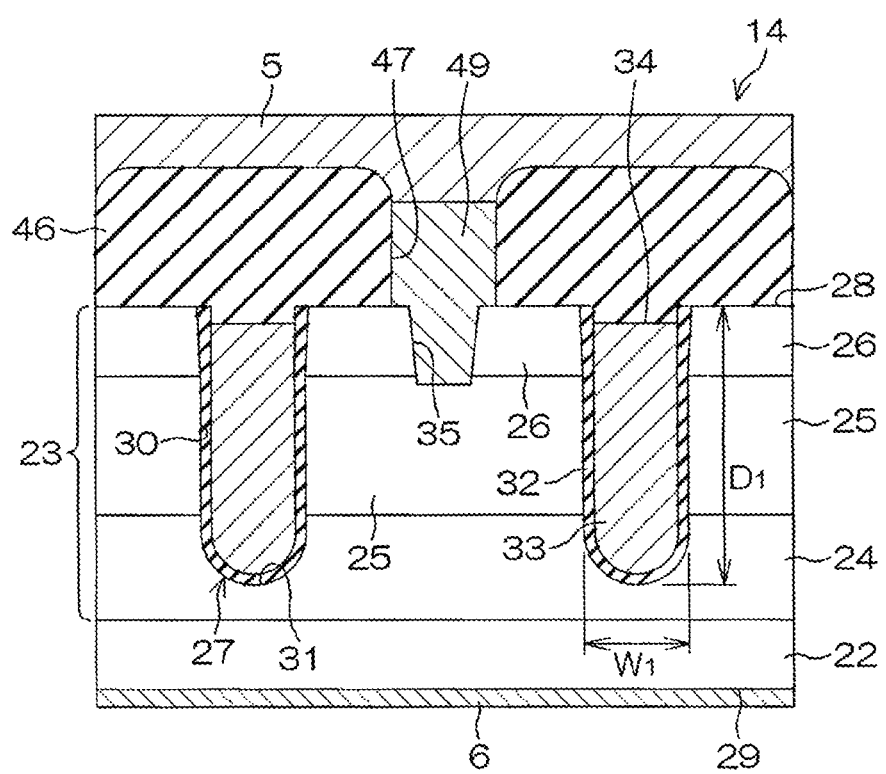
FIGS. 3A and 3B are schematic cross-sectional views of the semiconductor device, in which an A-A cross section and a B-B cross section in FIG. 2 are respectively shown.
Figure 3B:
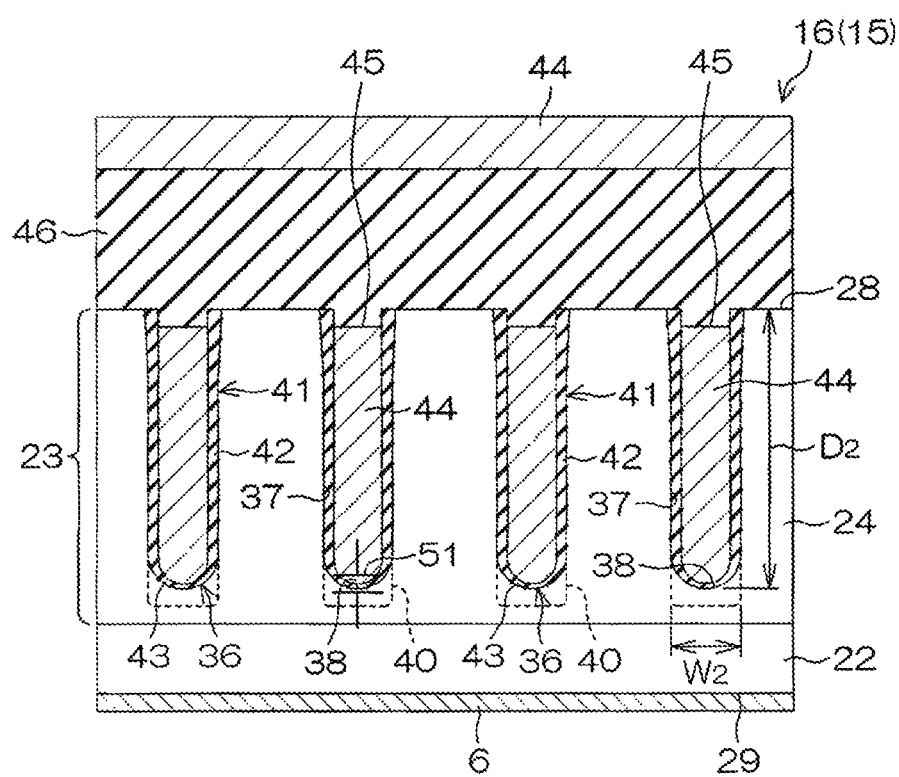

FIG. 2 is a schematic plan view of the semiconductor device 1. FIGS. 3A and 3B are schematic cross-sectional views of the semiconductor device 1, illustrating an A-A cross section and a B-B cross section, respectively, in FIG. 2. FIG. 3A illustrates a cross section of an active region 14, and FIG. 3B illustrates a cross section of a capacitor region 16.

The semiconductor device 1 has, for example, a square chip shape in the plan view, as illustrated in FIG. 2. Lengths of the chip-shaped semiconductor device 1 in the vertical and horizontal directions on the paper of FIG. 2 are respectively about several millimeters.

The semiconductor device 1 includes the active region 14 (indicated by a two-dot chain line in FIG. 2) arranged at a center thereof and functioning as a field effect transistor, and an inactive region 15 surrounding the active region 14.

The active region 14 may be defined as a region covered with the source electrode 5. On the other hand, the inactive region 15 may be defined as a region other than the active region 14, that is, a region outside the source electrode 5 in the plan view (a region not covered with the source electrode 5).

The inactive region 15 further includes the capacitor region 16 (a region under the gate pad and indicated by a two-dot chain line in FIG. 2), which is a region covered with the gate electrode 4, and an outer peripheral region 17 formed in a closed ring shape along an end face 19 of the semiconductor device 1 and surrounding the active region 14 and the capacitor region 16.

The source electrode 5 is formed on the surface of the semiconductor device 1 in the active region 14. The source electrode 5 has a substantially square shape in the plan view, and is formed so as to cover substantially the entire surface of the semiconductor device 1. A removal region 18 is formed near one corner of the semiconductor device 1 in the source electrode 5. This removal region 18 is a region in which the source electrode 5 is not formed, and is a region in which the gate electrode 4 is arranged. That is, the gate electrode 4 (*pad*) is arranged in the capacitor region 16, and the gate finger 7 connected to the gate electrode 4 is arranged in the outer peripheral region 17.

The capacitor region 16 is arranged adjacent to the active region 14 on the end face 19 side of the semiconductor device 1. In the capacitor region 16, a portion not facing the end face 19 of the semiconductor device 1 is surrounded by the active region 14 in the plan view. In the present embodiment, the capacitor region 16 is formed in a substantially square shape in the plan view, and includes a pair of outer sides 20 of the capacitor region 16 facing the end face 19 of the semiconductor device 1 and a pair of inner sides 21 facing the active region 14 (not facing the end face 19), in which the pair of inner sides 21 are adjacent to the active region 14.

Next, an internal structure of the semiconductor device 1 will be described.

The semiconductor device 1 includes a semiconductor substrate 22 and an epitaxial layer 23 epitaxially grown on a surface of the semiconductor substrate 22. The semiconductor substrate 22 and the epitaxial layer 23 constitute a semiconductor active region of the semiconductor device 1, and may be defined as an example of a semiconductor layer of the present disclosure.

In the present embodiment, the semiconductor substrate 22 may be an $n^+$-type silicon substrate. The semiconductor substrate 22 may be a substrate other than a silicon substrate, for example, a substrate such as a silicon carbide (SiC) substrate, a nitride semiconductor substrate (e.g., a GaN substrate), or the like.

In the active region 14, the epitaxial layer 23 includes a drift region 24 in contact with the semiconductor substrate 22, a channel region 25 stacked on the drift region 24, and a source region 26 stacked on the channel region 25, as illustrated in FIG. 3A. The conductivity types of the respective impurity regions 24 to 26 may be, for example, as follows: the drift region 24 may be $n^-$-type, the channel region 25 may be p-type, and the source region 26 may be $n_+$-type.

As illustrated in FIG. 2, the semiconductor device 1 has a basic structure as a trench gate type MOSFET having a plurality of gate trenches 27 as an example of first trenches of the present disclosure arranged in a stripe shape at intervals from each other in the plan view. A plurality of source regions 26 in the stripe shape in the plan view are partitioned by the stripe-shaped gate trenches 27. Although the gate trenches 27 are formed only in a portion of the active region 14 in FIG. 2, the gate trenches 27 may also be formed in the entire active region 14.

The gate trenches 27 are each formed from a surface 28 of the epitaxial layer 23 toward a rear surface 29 of the semiconductor substrate 22. The source region 26, the channel region 25, and the drift region 24 are exposed on a side portion 30 of the gate trench 27 sequentially from the surface 28 of the epitaxial layer 23 toward the rear surface 29 of the semiconductor substrate 22. Furthermore, the drift region 24 is exposed on a bottom portion 31 of the gate trench 27.

The side portion 30 and the bottom portion 31 of the gate trench 27 may be referred to as a side surface and a bottom surface of the gate trench 27, respectively, when there is a clear boundary for distinguishing the side surface and the bottom surface on the inner surface of the gate trench 27. On the other hand, when there is no clear boundary for distinguishing the side surface and the bottom surface on the inner surface of the gate trench 27 (for example, when the bottom portion 31 of the gate trench 27 is arc-shaped in cross section as illustrated in FIG. 3A, or the like), a portion to which at least only the drift region 24 is exposed may be referred to as the bottom portion 31 of the gate trench 27.

A gate insulating film 32 as an example of a first insulating film of the present disclosure is formed on the inner surface of the gate trench 27. The gate insulating film 32 is made of, for example, an insulating material such as silicon oxide (Sift), silicon nitride (SiN), or the like. In the present embodiment, the gate insulating film 32 has a substantially uniform thickness over the entire inner surface of the gate trench 27.

A polysilicon gate 33 as an example of a first embedded electrode of the present disclosure is embedded inside the gate insulating film 32 in the gate trench 27. Therefore, the polysilicon gate 33 faces the channel region 25 through the gate insulating film 32 on the side portion 30 of the gate trench 27. When a control voltage equal to or higher than a threshold value is applied to the polysilicon gate 33, an inversion layer (channel) is formed near the surface of the side portion 30 (channel region) of the gate trench 27 in the channel region 25. The source region 26 and the drift region 24 are electrically connected through the channel. When the control voltage applied to the polysilicon gate 33 is lower than the threshold value, a channel is not formed and thus the source region 26 and the drift region 24 are cut off.

In the present embodiment, the polysilicon gate 33 is embedded from the bottom portion 31 of the gate trench 27 to an intermediate portion of the source region 26 in the thickness direction toward the surface 28 of the epitaxial layer 23. Therefore, the polysilicon gate 33 has an upper surface 34 at a position lower than the surface 28 of the epitaxial layer 23 (a position on the bottom portion 31 side of the gate trench 27 with respect to the surface 28). In other words, the polysilicon gate 33 may be referred to as a gate electrode. In this case, the gate electrode 4 may be referred to as a surface gate electrode in order to distinguish it from the polysilicon gate 33.

In addition, a contact trench 35 is formed in the epitaxial layer 23 in the active region 14. The contact trench 35 may be formed, for example, between adjacent gate trenches 27, as illustrated in FIG. 3A.

The contact trench 35 is formed from the surface 28 of the epitaxial layer 23 toward the rear surface 29 of the semiconductor substrate 22, and has a bottom portion in the middle of the channel region 25 in the thickness direction. Therefore, at least the source region 26 is exposed on a side portion of the contact trench 35, and the channel region 25 is exposed on the bottom portion of the contact trench 35. As illustrated in FIG. 3A, a portion of the channel region 25 may also be exposed on the side portion (a side surface in the present embodiment) of the contact trench 35.

In the capacitor region 16, the epitaxial layer 23, from the surface 28 to the semiconductor substrate 22 as a whole in the thickness direction, is constituted by the drift region 24. Furthermore, a plurality of capacitor trenches 36 as an example of second trenches of the present disclosure are formed in the capacitor region 16, as illustrated in FIG. 2.

The capacitor trenches 36 are arranged in a stripe shape at intervals from each other in the plan view. In the present embodiment, the capacitor trenches 36 extend in a direction (a horizontal direction on the paper of FIG. 2) orthogonal to the stripe direction of the gate trenches 27 (a vertical direction on the paper of FIG. 2). In addition, although not shown, the capacitor trenches 36 may extend in a direction obliquely intersecting the stripe direction of the gate trenches 27.

The capacitor trenches 36 are each formed from the surface 28 of the epitaxial layer 23 toward the rear surface 29 of the semiconductor substrate 22. The drift region 24 is exposed on a side portion 37 and a bottom portion 38 of the capacitor trench 36. That is, the capacitor trench 36 may not reach the semiconductor substrate 22 and may have the bottom portion 38 in the drift region 24.

The side portion 37 and the bottom portion 38 of the capacitor trench 36 may be referred to as a side surface and a bottom surface of the capacitor trench 36, respectively, when there is a clear boundary for distinguishing the side surface and the bottom surface on the inner surface of the capacitor trench 36. On the other hand, when there is no clear boundary for distinguishing the side surface and the bottom surface on the inner surface of the capacitor trench 36 (for example, when the bottom portion 38 of the capacitor trench 36 is arc-shaped in cross section as illustrated in FIG. 3B), at least the arc-shaped portion may be referred to as the bottom portion 38 of the capacitor trench 36.

Furthermore, a width $W_2$ of the capacitor trench 36 may be smaller than a width $W_1$ of the gate trench 27. In addition, a depth $D_2$ of the capacitor trench 36 may be equal to a depth $D_1$ of the gate trench 27. Furthermore, a pitch $P_2$ of the capacitor trenches 36 (a distance between the central portions of the adjacent capacitor trenches 36, see FIG. 2) may be smaller than a pitch $P_1$ of the gate trenches 27.

Furthermore, as illustrated in FIG. 2, the capacitor trench 36 extends from the capacitor region 16 toward the active region 14, and includes a portion arranged in the active region 14. In the present embodiment, the plurality of stripe-shaped capacitor trenches 36 are installed across a boundary between the capacitor region 16 and the active region 14, and have end portions 39 arranged in the active region 14.

In addition, in the epitaxial layer 23 (drift region 24), a high-concentration impurity region 40 having an impurity concentration higher than that of the drift region 24 is formed in the bottom portion 38 of the capacitor trench 36. In the present embodiment, the high-concentration impurity region 40 may be an n-type semiconductor region or an $n^+$-type semiconductor region having an impurity concentration higher than that of the $n^-$-type drift region 24.

A capacitance film 41 as an example of the second insulating film of the present disclosure is formed on the inner surface of the capacitor trench 36. The capacitance film 41 may be made of the same material as the gate insulating film 32, and is made of, for example, an insulating material such as silicon oxide ($SiO_2$), silicon nitride (SiN), or the like. In the present embodiment, the capacitance film 41 includes a first portion 42 formed on the side portion 37 of the capacitor trench 36 and a second portion 43 formed on the bottom portion 38 of the capacitor trench 36.

The second portion 43 of the capacitance film 41 may have a thickness smaller than that of the first portion 42 of the capacitance film 41.

In the capacitor trench 36, a polysilicon electrode 44 as an example of a second embedded electrode of the present disclosure is embedded in the capacitance film 41. Therefore, the polysilicon electrode 44 faces the drift region 24 through the capacitance film 41 on the side portion 37 of the capacitor trench 36. On the other hand, the polysilicon electrode 44 faces the high-concentration impurity region 40 through the capacitance film 41 on the bottom portion 38 of the capacitor trench 36. Further, when the high-concentration impurity region 40 is not formed, the polysilicon electrode 44 may face the drift region 24 through the capacitance film 41 on the bottom portion 38 of the capacitor trench 36.

Therefore, a capacitor 51 constituted by the high-concentration impurity region 40 (drift region 24) and the polysilicon electrode 44 facing each other with the capacitance film 41 interposed therebetween is installed in the capacitor region 16.

In the present embodiment, the polysilicon electrode 44 is embedded from the bottom portion 38 of the capacitor trench 36 to an intermediate portion of the epitaxial layer 23 in the thickness direction toward the surface 28 of the epitaxial layer 23. Therefore, the polysilicon electrode 44 has an upper surface 45 at a position lower than the surface 28 of the epitaxial layer 23 (a position on the bottom portion 38 side of the capacitor trench 36 with respect to the surface 28).

An interlayer insulating film 46 as an example of the insulating film of the present disclosure is formed on the surface 28 of the epitaxial layer 23. The interlayer insulating film 46 is made of, for example, an insulating material such as silicon oxide ($SiO_2$), silicon nitride (SiN), or the like.

In the interlayer insulating film 46, as illustrated in FIG. 3A, a contact hole 47 connected to the contact trench 35 is formed in the active region 14. Therefore, the source region 26 and the channel region 25 face the contact hole 47 from the inner surface of the contact trench 35.

Furthermore, as illustrated in FIG. 2, a contact hole 48 is formed in a portion covering the end portion 39 of the capacitor trench 36 in the interlayer insulating film 46. Although the cross section is not shown in the drawing, the upper surface 45 of the polysilicon electrode 44 faces the contact hole 48.

Contact plugs 49 and 50 are embedded in the contact holes 47 and 48, respectively. The contact plugs 49 and 50 are made of, for example, a metal material such as tungsten (W) or the like. Although not shown in cross section, the contact plug 50 is embedded in the interlayer insulating film 46 in the same form as the contact plug 49.

Furthermore, an electrode film constituting the source electrode 5, the gate electrode 4, and the gate finger 7 is formed on the interlayer insulating film 46. The electrode film is made of, for example, a metal material such as aluminum (Al) or the like. Although not shown, a surface insulating film may be further formed on the interlayer insulating film 46 so as to cover the source electrode 5, the gate electrode 4, and the gate finger 7. The source electrode 5 and the gate electrode 4 may be partially exposed from the surface insulating film as pads.

The source electrode 5 is connected to the source region 26, the channel region 25, and the polysilicon electrode 44 via the contact plugs 49 and 50. Therefore, the polysilicon electrode 44 has the same potential as the source electrode 5.

On the other hand, the polysilicon gate 33 is drawn out onto the surface 28 of the epitaxial layer 23 at a position not shown, and is connected to the gate finger 7. Therefore, the polysilicon gate 33 has the same potential as the gate finger 7 (gate electrode 4).

The drain electrode 6 is made of, for example, a metal material such as aluminum (Al) or the like, and is formed so as to be brought into ohmic contact with the rear surface 29 of the semiconductor substrate 22. Therefore, the drift region 24 has the same potential as the drain electrode 6.

FIGS. 4A and 4B to FIGS. 10A and 10B are views illustrating some of manufacturing processes of the semiconductor device 1 in FIGS. 3A and 3B in the order of processes.

Figure 4A:
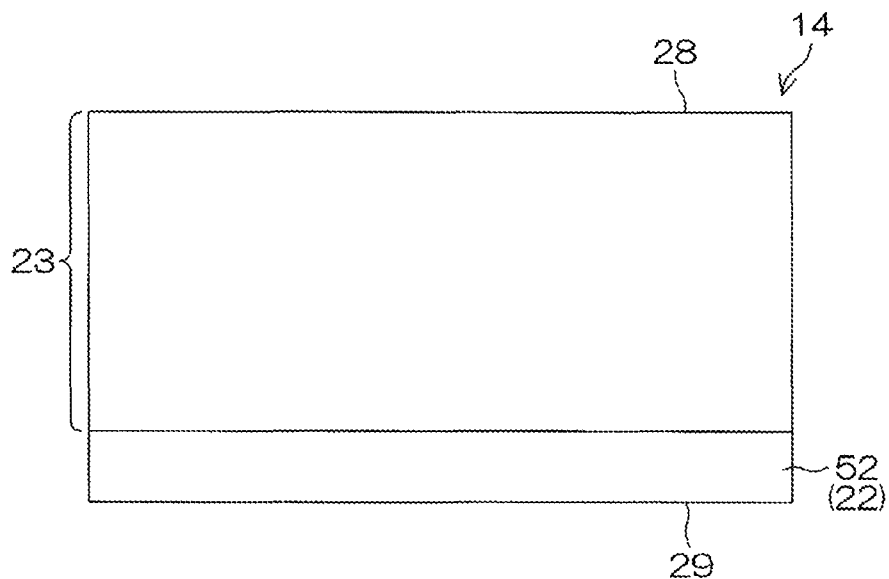
FIGS. 4A and 4B are views illustrating a portion of manufacturing processes of the semiconductor device in FIGS. 3A and 3B.
Figure 4B:
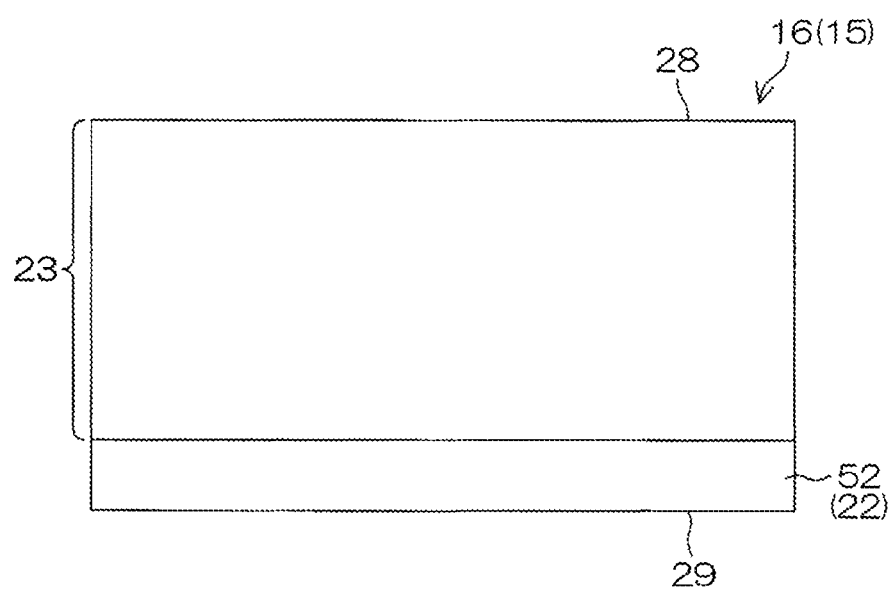

In order to manufacture the semiconductor device 1, first, one disk-shaped semiconductor wafer 52 is provided with reference to FIGS. 4A and 4B. The semiconductor wafer 52 corresponds to the semiconductor substrate 22 described above. An epitaxial layer 23 is formed on the semiconductor wafer 52 by epitaxially growing a semiconductor while implanting an n-type impurity. The n-type impurity used at this time may include, for example, phosphorus (P), arsenic (As), antimony (Sb), and the like.

Figure 5A:
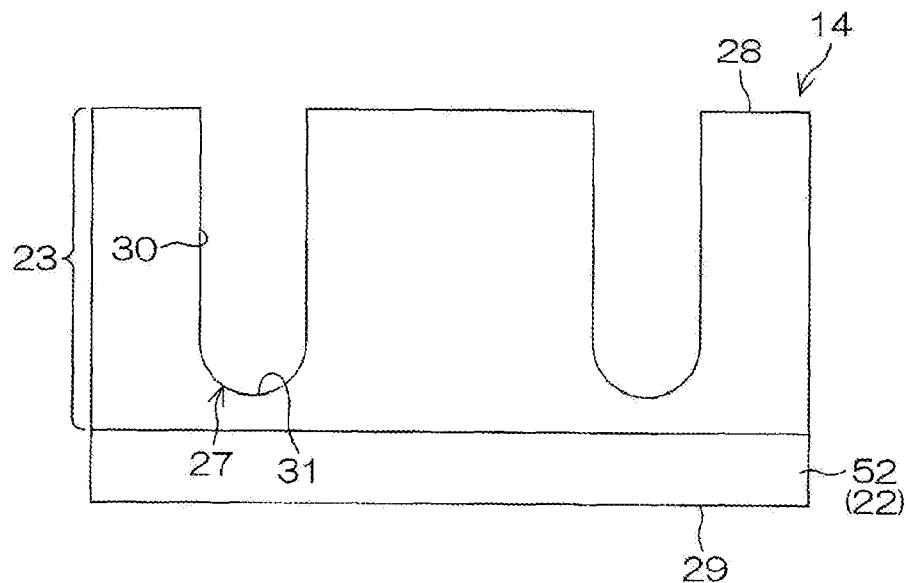
FIGS. 5A and 5B are views illustrating a next process of FIGS. 4A and 4B.
Figure 5B:
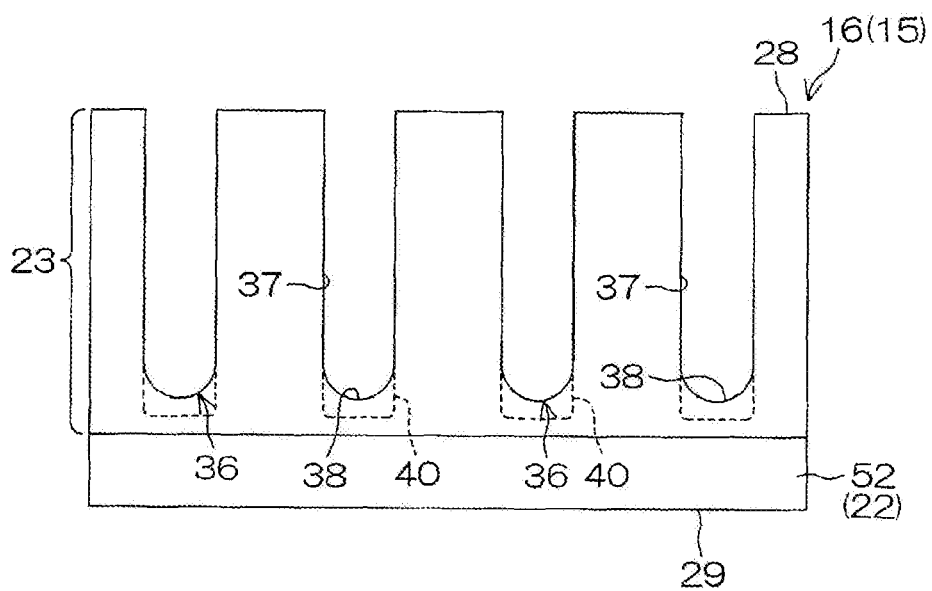

Next, referring to FIG. 5A and FIG. 5B, a mask (for example, a photoresist (not shown)) is formed on a surface 28 of the epitaxial layer 23, and a gate trench 27 and a capacitor trench 36 are simultaneously formed on the epitaxial layer 23 by etching through the mask. Thereafter, for example, an n-type impurity is selectively implanted into a bottom portion 38 of the capacitor trench 36 and diffused by a subsequent annealing process to form a high-concentration impurity region 40. The n-type impurity used at this time includes, for example, phosphorus (P), arsenic (As), antimony (Sb), and the like.

Figure 6A:
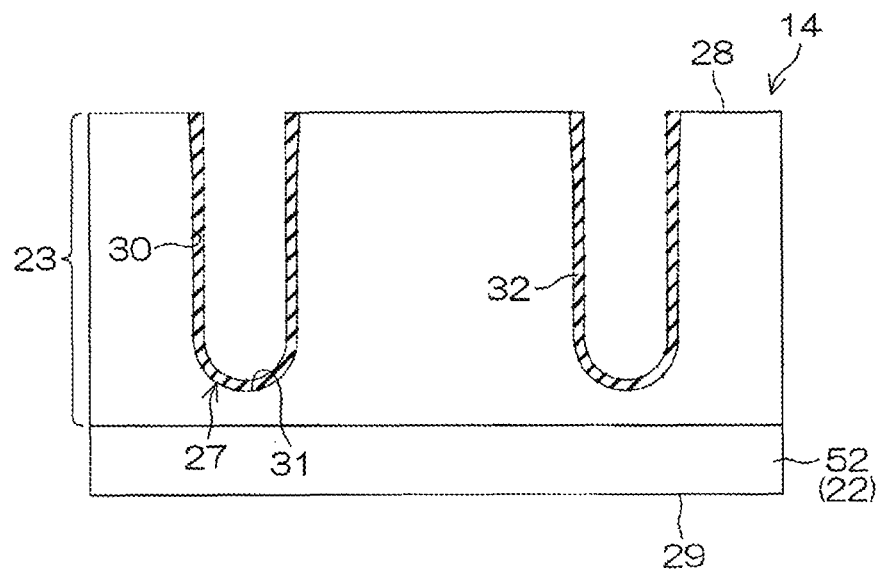
FIGS. 6A and 6B are views illustrating a next process of FIGS. 5A and 5B.
Figure 6B:
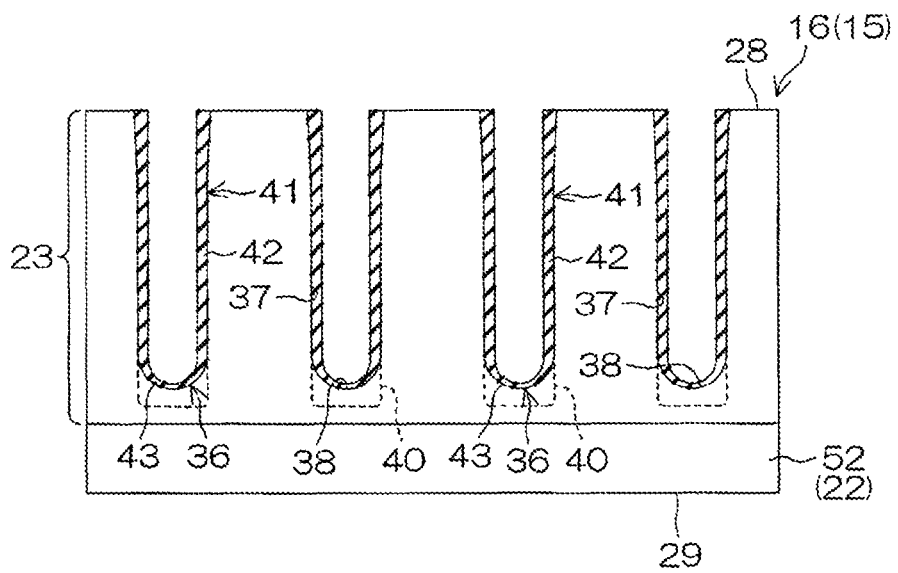

Next, referring to FIGS. 6A and 6B, an insulating film is formed on the entire surface 28 of the epitaxial layer 23 including inner surfaces of the gate trench 27 and the capacitor trench 36 by, for example, a thermal oxidation method. Thereafter, the insulating film on the surface 28 of the epitaxial layer 23 is removed so as to leave the insulating film on the respective inner surfaces of the gate trench 27 and the capacitor trench 36. Consequently, a gate insulating film 32 and a capacitance film 41 are simultaneously formed.

At this time, as illustrated in FIG. 2, since the capacitor trench 36 is formed in a stripe shape orthogonal to the stripe direction of the gate trench 27, it is possible to prevent warpage of the semiconductor wafer 52 by stress of the insulating film covering the entire surface 28 of the epitaxial layer 23. In addition, since a width $W_2$ (see FIG. 3B) of the capacitor trench 36 is small and it is difficult for an oxygen gas ($O_2$ gas) supplied at the time of thermal oxidation to reach the bottom portion 38 of the capacitor trench 36, a second portion 43 having a small thickness is selectively formed on the bottom portion 38. On the other hand, since a width $W_1$ of the gate trench 27 (see FIG. 3A) is relatively large, the oxygen gas is uniformly distributed in the gate trench 27 and the gate insulating film 32 having a substantially uniform thickness is formed.

Figure 7A:
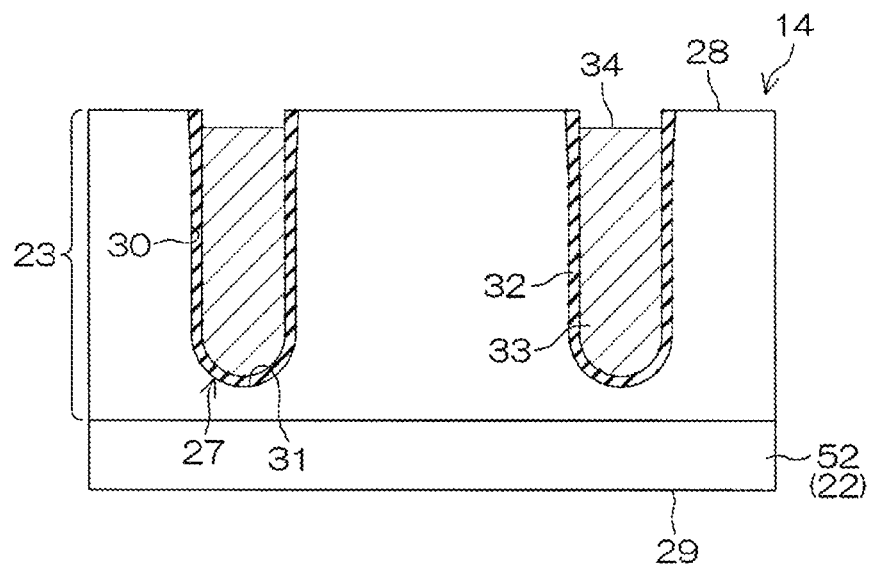
FIGS. 7A and 7B are views illustrating a next process of FIGS. 6A and 6B.
Figure 7B:
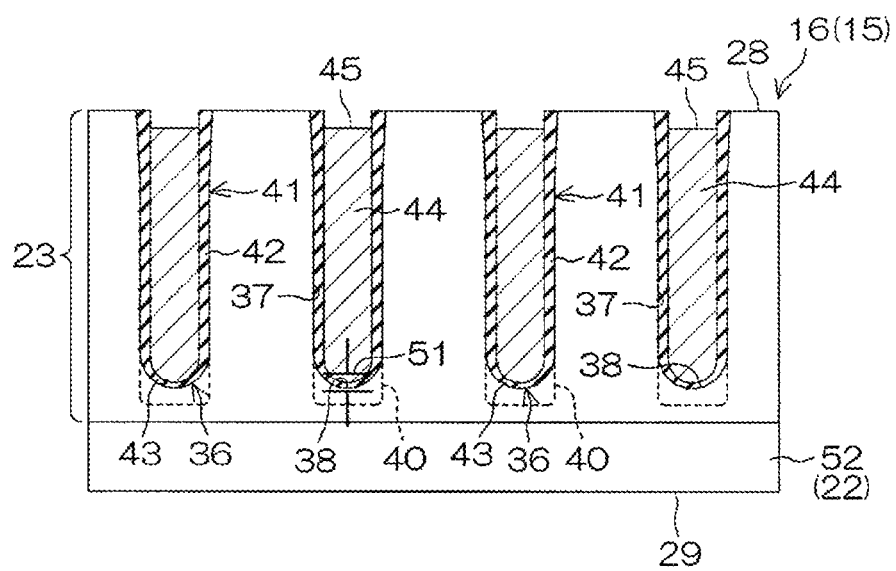

Next, referring to FIGS. 7A and 7B, a polysilicon film (not shown) is formed on the surface 28 of the epitaxial layer 23 by, for example, a CVD method. The polysilicon film may be made of, for example, doped polysilicon implanted with an n-type impurity. Thereafter, an unnecessary portion of the polysilicon film is selectively removed by, for example, etch back. More specifically, in the active region 14, the polysilicon film is removed until the upper surface 34 reaches an intermediate portion of the gate trench 27 in the depth direction. On the other hand, in the capacitor region 16, the polysilicon film is removed until the upper surface 45 reaches an intermediate portion of the capacitor trench 36 in the depth direction. Consequently, the polysilicon gate 33 and the polysilicon electrode 44 are simultaneously formed.

Figure 8A:
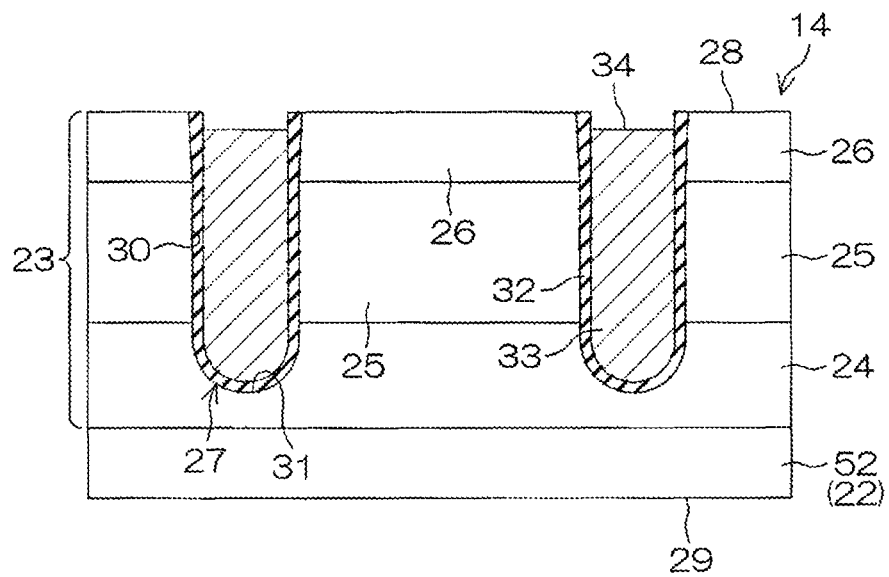
FIGS. 8A and 8B are views illustrating a next process of FIGS. 7A and 7B.
Figure 8B:
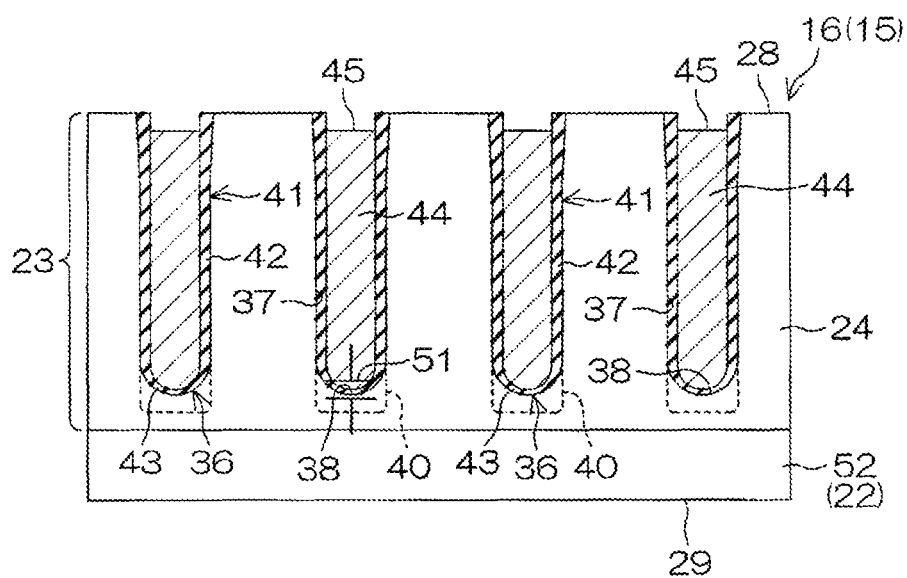

Next, referring to FIGS. 8A and 8B, a p-type impurity and an n-type impurity are sequentially implanted at a predetermined depth from the surface 28 of the epitaxial layer 23. Thereafter, a p-type channel region 25 and an $n^+$-type source region 26 are formed by diffusion in a subsequent annealing process. In addition, a region other than the channel region 25 and the source region 26 is formed as an $n^-$-type drift region 24 in which the conductivity type after the formation of the epitaxial layer 23 is maintained. The p-type impurity when forming the channel region 25 includes, for example, boron (B), aluminum (Al), gallium (Ga), and the like, and the n-type impurity when forming the source region 26 includes, for example, phosphorus (P), arsenic (As), antimony (Sb), and the like.

Figure 9A:
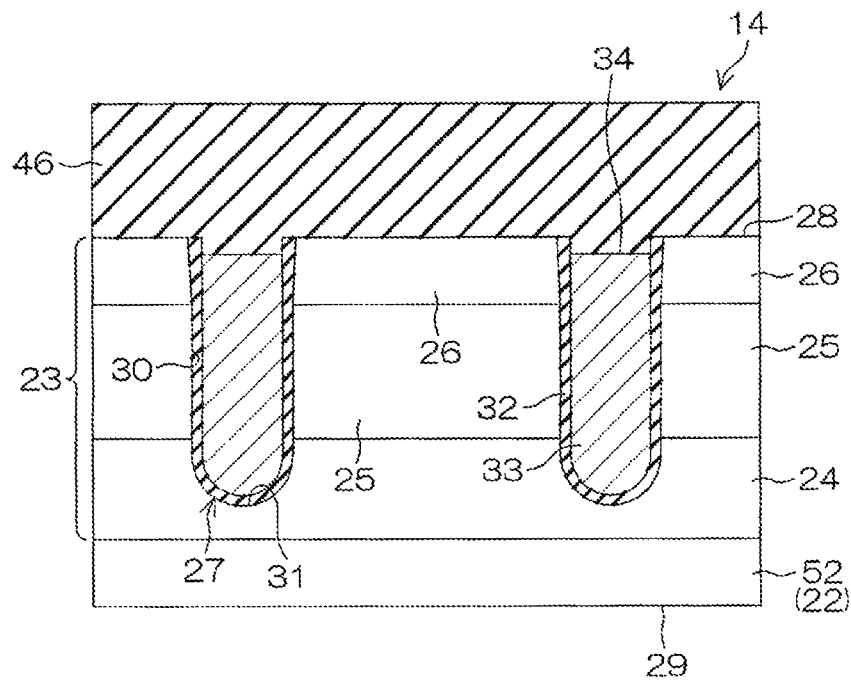
FIGS. 9A and 9B are views illustrating a next process of FIGS. 8A and 8B.
Figure 9B:
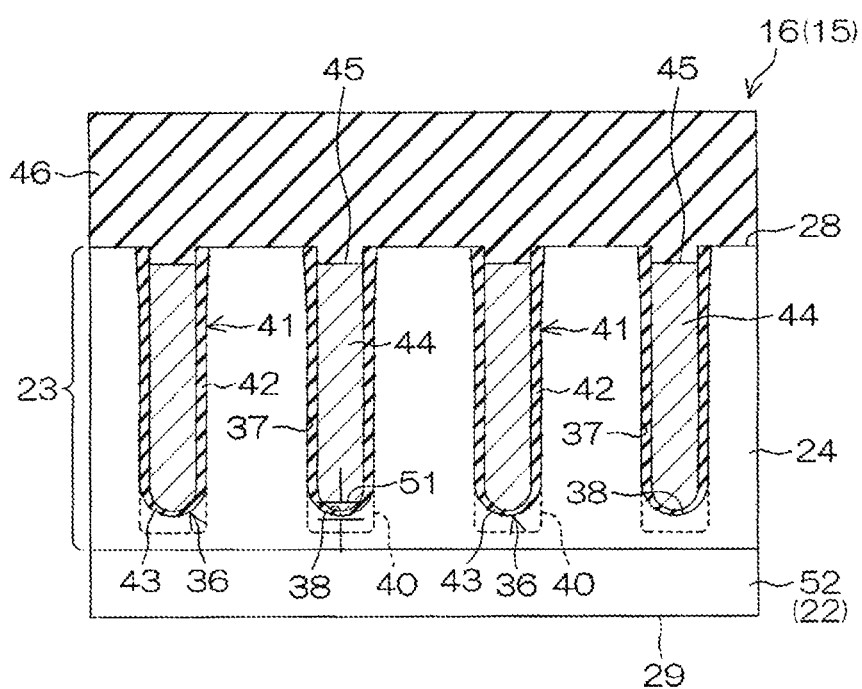

Next, referring to FIGS. 9A and 9B, an interlayer insulating film 46 is formed on the surface 28 of the epitaxial layer 23 by, for example, a CVD method.

Figure 10A:
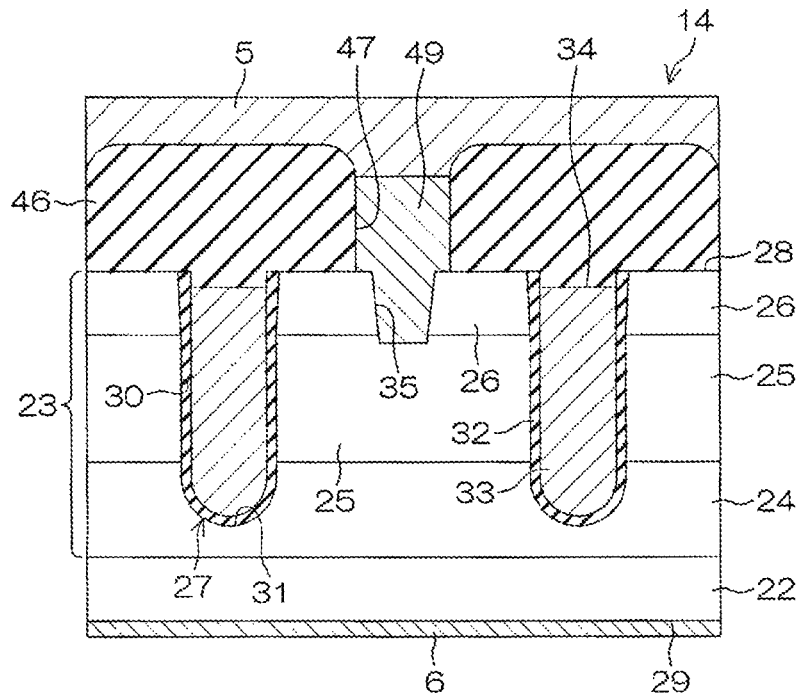
FIGS. 10A and 10B are views illustrating a next process of FIGS. 9A and 9B.
Figure 10B:
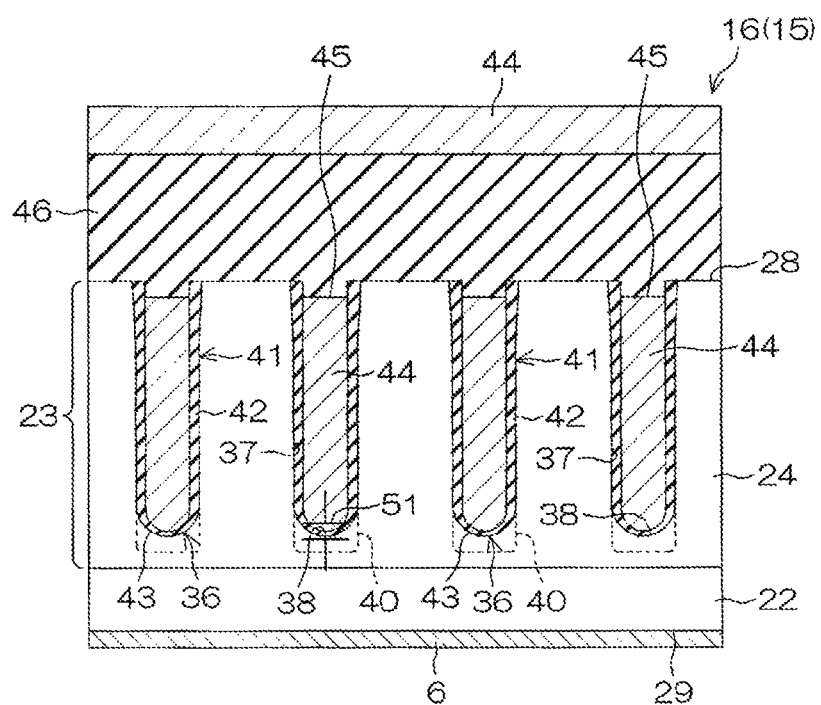

Next, referring to FIGS. 10A and 10B, a contact hole 47 and a contact hole 48 (see FIG. 2) are simultaneously formed by, for example, selectively etching the interlayer insulating film 46. Next, a contact trench 35 is formed by etching the epitaxial layer 23 exposed from the contact hole 47 from the surface 28.

Next, contact plugs 49 and 50 are embedded in the contact holes 47 and 48, and then, an electrode film is formed on the interlayer insulating film 46 by, for example, a sputtering method. Thereafter, a gate electrode 4, a source electrode 5, and a gate finger 7 are simultaneously formed by selectively etching the electrode film. Next, an electrode film is formed on the entire rear surface 29 of the semiconductor wafer 52 by, for example, a sputtering method. Accordingly, a drain electrode 6 is formed. Thereafter, the semiconductor wafer 52 is divided into individual chips (semiconductor device 1) to obtain the semiconductor device 1 described above.

As described above, according to the semiconductor device 1, the active region 14 does not need to be sacrificed to secure the capacitor region 16 by effectively utilizing a region covered with the gate electrode 4 (gate pad) as the capacitor region 16. As a result, since the active region 14 can be widely used, it is possible to suppress a reduction in the allowable amount of current flowing through the active region 14.

Furthermore, a capacitor 51 constituted by the polysilicon electrode 44 and the high-concentration impurity region 40 (drift region 24) facing each other with the capacitance film 41 interposed therebetween is formed in the capacitor region 16. The capacitor 51 is connected in parallel to a current path between the source electrode 5 and the drain electrode 6 (between the source and the drain). Thus, it is possible to suppress generation of noise when the current path between the source and the drain is turned off.

In addition, since the second portion 43 is selectively formed to be thin in the capacitance film 41 and thus a distance between the polysilicon electrode 44 and the high-concentration impurity region 40 (the drift region 24) facing each other with the second portion 43 interposed therebetween can be shortened, it is possible to increase the capacity of the capacitor 51. Furthermore, the capacitor trenches 36 are arranged with a width $W_2$ and a pitch $P_2$ smaller than those of the gate trenches 27. Therefore, since the capacitor 51 can be integrated in high density in the capacitor region 16 having a limited size, it is also possible to increase the capacity of the capacitor 51 as a whole.

In addition, the capacity of the capacitor 51 can also be increased by forming the high-concentration impurity region 40 on the bottom portion 38 of the capacitor trench 36.

Next, a usage example of the aforementioned semiconductor device 1 will be described with reference to FIGS. 11 and 12.

Figure 11:
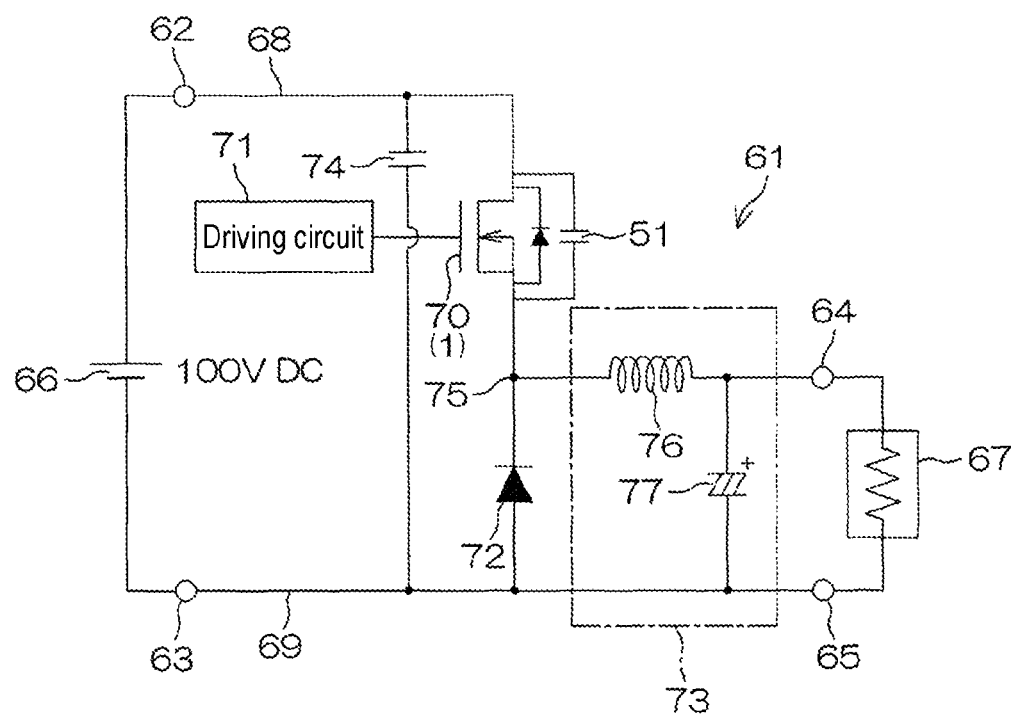
FIG. 11 is an electric circuit diagram of a DC/DC converter as a switching operation circuit using the semiconductor device.

FIG. 11 is an electric circuit diagram of a DC/DC converter 61 as a switching operation circuit using the semiconductor device 1.

The DC/DC converter 61 is configured to convert a DC power source voltage supplied to power terminals 62 and 63 (step down in the present embodiment) to output a converted DC voltage between output terminals 64 and 65. A DC power source 66 is connected between the power terminals 62 and 63. More specifically, a positive electrode of the DC power source 66 is connected to the power terminal 62, and a negative electrode of the DC power source 66 is connected to the power terminal 63. On the other hand, a load 67 to which the converted DC voltage is to be supplied is connected between the output terminals 64 and 65.

The DC/DC converter 61 includes a switching element 70, a driving circuit 71, a diode 72 as a rectifying element, a smoothing circuit 73, and a capacitor 74. The power terminal 62 is connected to a power source voltage line 68, and the power source terminal 63 is connected to a ground line 69.

The capacitor 74 is connected between the power source voltage line 68 and the ground line 69. In the present embodiment, the switching element 70 includes an n-channel MOSFET (the semiconductor device 1 described above) having a drain terminal connected to the power source voltage line 68 and a source terminal connected to a cathode of the diode 72. An anode of the diode 72 is connected to the ground line 69. The diode 72 may be a Schottky barrier diode. The driving circuit 71 is connected to a gate terminal of the switching element 70. The driving circuit 71 is configured to supply a control signal for switching the switching element 70. The control signal may be a rectangular wave signal or a sinusoidal signal.

The smoothing circuit 73 is configured to smooth a voltage derived at a connection point 75 between the switching element 70 and the diode 72 and supply a smoothed voltage to the output terminal 64. The smoothing circuit 73 includes a choke coil 76 and a capacitor 77. One terminal of the choke coil 76 is connected to the connection point 75, and the other terminal thereof is connected to the output terminal 64. The capacitor 77 is connected between the other terminal and the ground line 69. The capacitor 77 is connected so that a terminal on its positive side is on the output terminal 64 side.

When the switching element 70 is turned on by supplying the control signal from the driving circuit 71 to the gate of the switching element 70, a current supplied from the DC power source 66 flows into the choke coil 76 to store energy in the choke coil 76 and charge the capacitor 77 so as to raise potential of the output terminal 64. Thereafter, when the switching element 70 is turned off by the control signal from the driving circuit 71, the choke coil 76 tries to maintain the current from the connection point 75 to the output terminal 64 and therefore the current flows through the diode 72 and the voltage derived at the output terminal 64 is held. The voltage appearing on the output terminal 64 side of the choke coil 76 is smoothed by the capacitor 74 and the capacitor 51 of the switching element 70 so that a stable voltage is derived at the output terminal 64. By this operation, the DC voltage supplied between the power terminals 62 and 63 is stepped-down according to a duty ratio of the control signal applied to the gate of the switching element 70, and the stepped-down DC voltage is derived between the output terminals 64 and 63 and 65.

The capacitor 74 holds the voltage supplied from the DC power source 66, and supplies the current to the switching element 70 from the vicinity of the switching element 70, thereby reducing an effect of cable inductance from the DC power source 66 to the power terminals 62 and 63.

Figure 12:
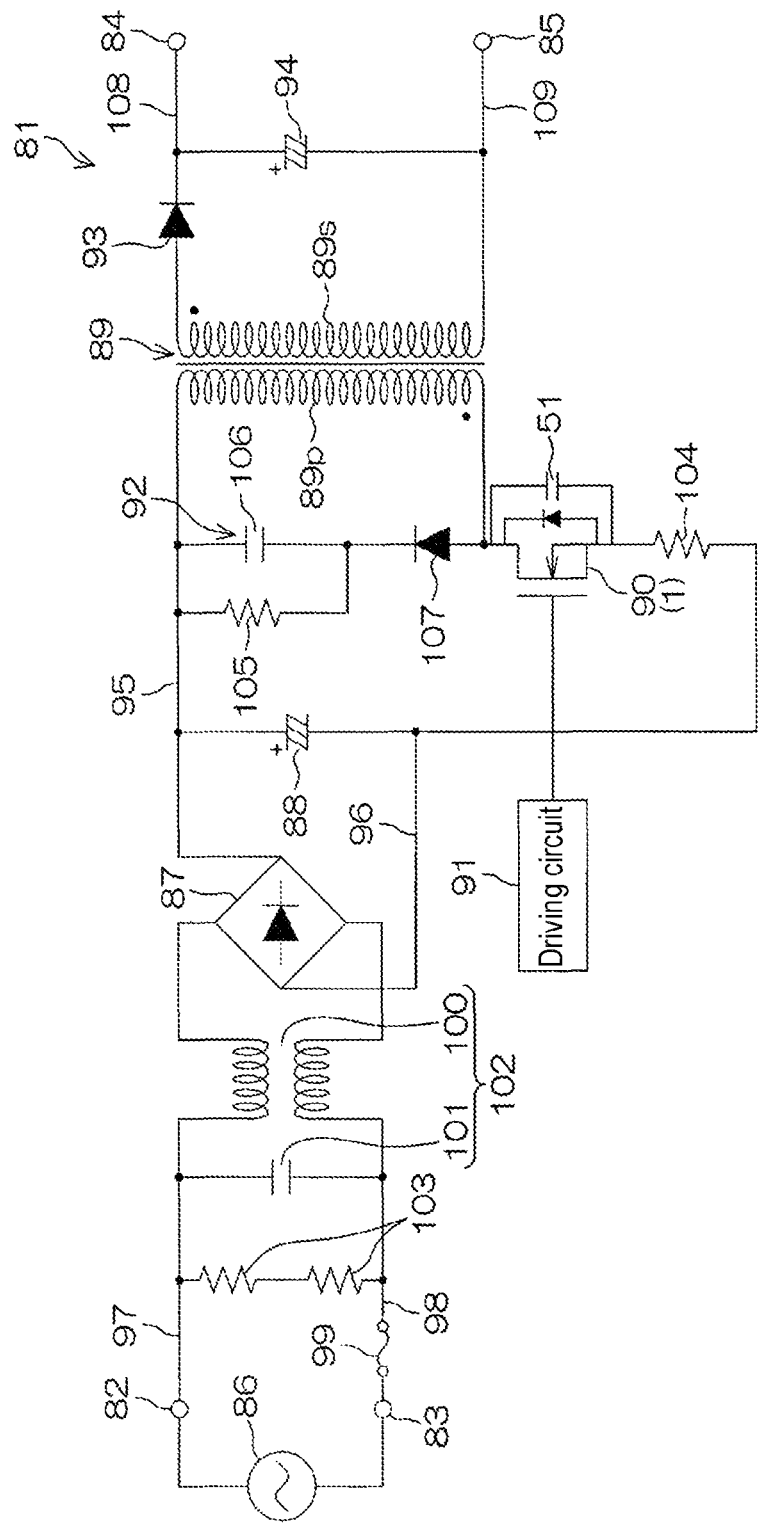
FIG. 12 is an electric circuit diagram of an AC/DC power source circuit (a so-called AC adapter) as a switching operation circuit using the semiconductor device.

FIG. 12 is an electric circuit diagram of an AC/DC power source circuit 81 (a so-called AC adapter) as a switching operation circuit using the semiconductor device 1.

The AC/DC power source circuit 81 includes power terminals 82 and 83 connected to an AC power source 86, and output terminals 84 and 85 outputting a DC voltage. That is, the AC/DC power source circuit 81 is configured to rectify an AC voltage (e.g., 100 V) from the AC power source 86 to output a DC voltage of a predetermined level between the output terminals 84 and 85.

The AC/DC power source circuit 81 includes a rectifying circuit 87, a smoothing capacitor 88, a high-frequency transformer 89, a switching element 90, and a driving circuit 91. Electric power from the AC power source 86 is supplied to a pair of input terminals of the rectifier circuit 87 configured as a diode bridge via a pair of power supply lines 97 and 98. A fuse 99 is interposed in one power supply line 98. A noise filter (input line filter) 102 is installed between the fuse 99 and the rectifying circuit 87. In this example, the noise filter 102 includes a balun transformer 100 and a bypass capacitor 101 connected between the power supply lines 97 and 98. Electric resistors 103 configured to absorb noise are connected across the power supply lines 97 and 98 between the fuse 99 and the noise filter 102.

A pair of output terminals of the rectifying circuit 87 are connected to a high-voltage line 95 and a low-voltage line 96, respectively. The smoothing capacitor 88 is configured as an electrolytic capacitor connected between the high-voltage line 95 and the low-voltage line 96. One terminal of a primary winding 89p of the high-frequency transformer 89 is connected to the high-voltage line 95, and the other terminal thereof is connected to the low-voltage line 96. The switching element 90 and an electric resistor 104 are connected in series to the low voltage line 96 between the primary winding 89p of the high-frequency transformer 89 and the rectifying circuit 87.

Furthermore, a snubber circuit 92 is connected between the high-voltage line 95 and the low-voltage line 96 on the high-frequency transformer 89 side of the switching element 90 in parallel with the primary winding 89p. The snubber circuit 92 includes a parallel circuit of an electric resistor 105 and a capacitor 106, and a diode 107 connected in series to the parallel circuit. The snubber circuit 92 absorbs a spike-like high voltage accompanying switching of the switching element 90, together with the capacitor 51 of the switching element 90, so as to minimize electromagnetic noise.

In the present embodiment, a secondary winding 89s of the high-frequency transformer 89 is wound in the opposite direction to the primary winding 89p. One end of the secondary winding 89s is connected to an output high-voltage line 108, and the other end thereof is connected to an output low-voltage line 109.

A diode 93 as a rectifying element is interposed in the output high-voltage line 108. More specifically, an anode of the diode 93 is connected to the secondary winding 89s, and a cathode thereof is connected to the output terminal 84. Furthermore, the output low-voltage line 109 is connected to the output terminal 85. An electrolytic capacitor 94 for smoothing is connected between the output high-voltage line 108 and the output low-voltage line 109. A positive terminal of the electrolytic capacitor 94 is connected to the output high-voltage line 108 between the diode 93 and the output terminal 84.

In the present embodiment, the switching element 90 is configured as an n-channel MOSFET (the semiconductor device 1 described above) having a drain connected to the primary winding 89p of the high-frequency transformer 89 and a source connected to the rectifying circuit 87 via the electric resistor 104. In the present embodiment, the primary winding 89p may be regarded as a choke coil connected to the switching element 90.

The control signal output from the driving circuit 91 is input to a gate terminal of the switching element 90. The driving circuit 91 supplies a rectangular wave driving pulse having a frequency of, for example, 1 MHz or higher, as the control signal to the gate of the switching element 90.

When the switching element 90 is turned on, a current flows through the primary winding 89p of the high-frequency transformer 89 to generate an induced electromotive force in the secondary winding 89s. Since this induced electromotive force is an electromotive force in a direction in which a current in a reverse direction flows through the diode 93, no current flows on the secondary side of the high frequency transformer 89 and energy is stored in the secondary winding 89s. Thereafter, when the switching element 90 is turned off, an electromotive force, which causes a forward current to flow through the diode 93, is generated in the secondary winding 89s and the diode 93 becomes conductive. In this manner, energy is transmitted from the primary winding 89p of the high-frequency transformer 89 to the secondary winding 89s by a flyback method, and a voltage transformed according to a ratio of the numbers of windings of the primary winding 89p and the secondary winding 89s is generated in the secondary winding 89s. This voltage is rectified by the diode 93 and smoothed by the electrolytic capacitor 94 so that a DC voltage of a predetermined level is derived at the output terminals 84 and 85.

One embodiment of the present disclosure has been described above, but the present disclosure may be implemented in other forms.

Figure 13:
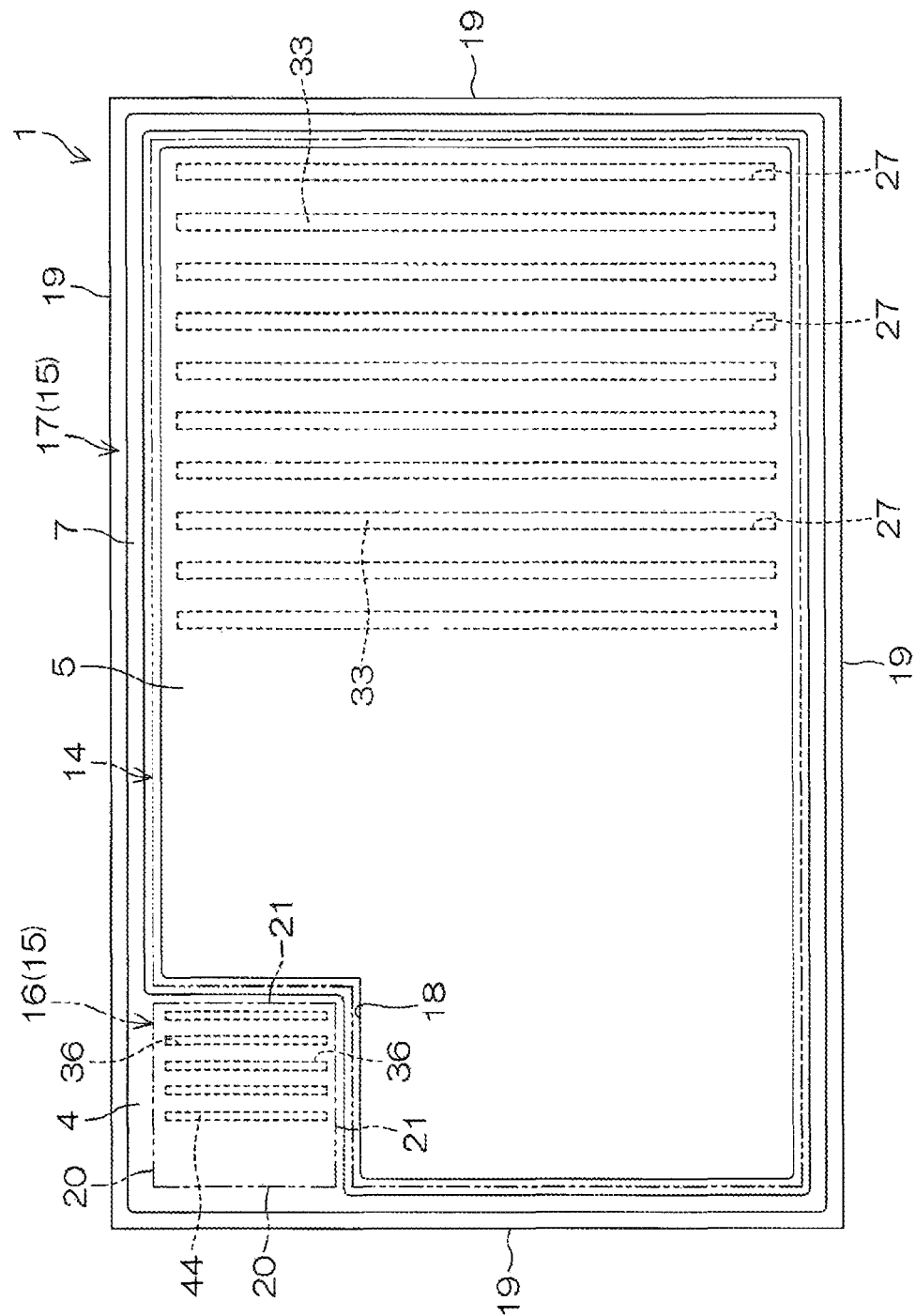
FIG. 13 is a diagram illustrating an exemplary modification of the semiconductor device in FIG. 2.

For example, the capacitor trench 36 does not need to extend in a direction intersecting the stripe direction of the gate trench 27, and may extend in a direction parallel to the stripe direction of the gate trench 27, as illustrated in FIG. 13.

Figure 14:
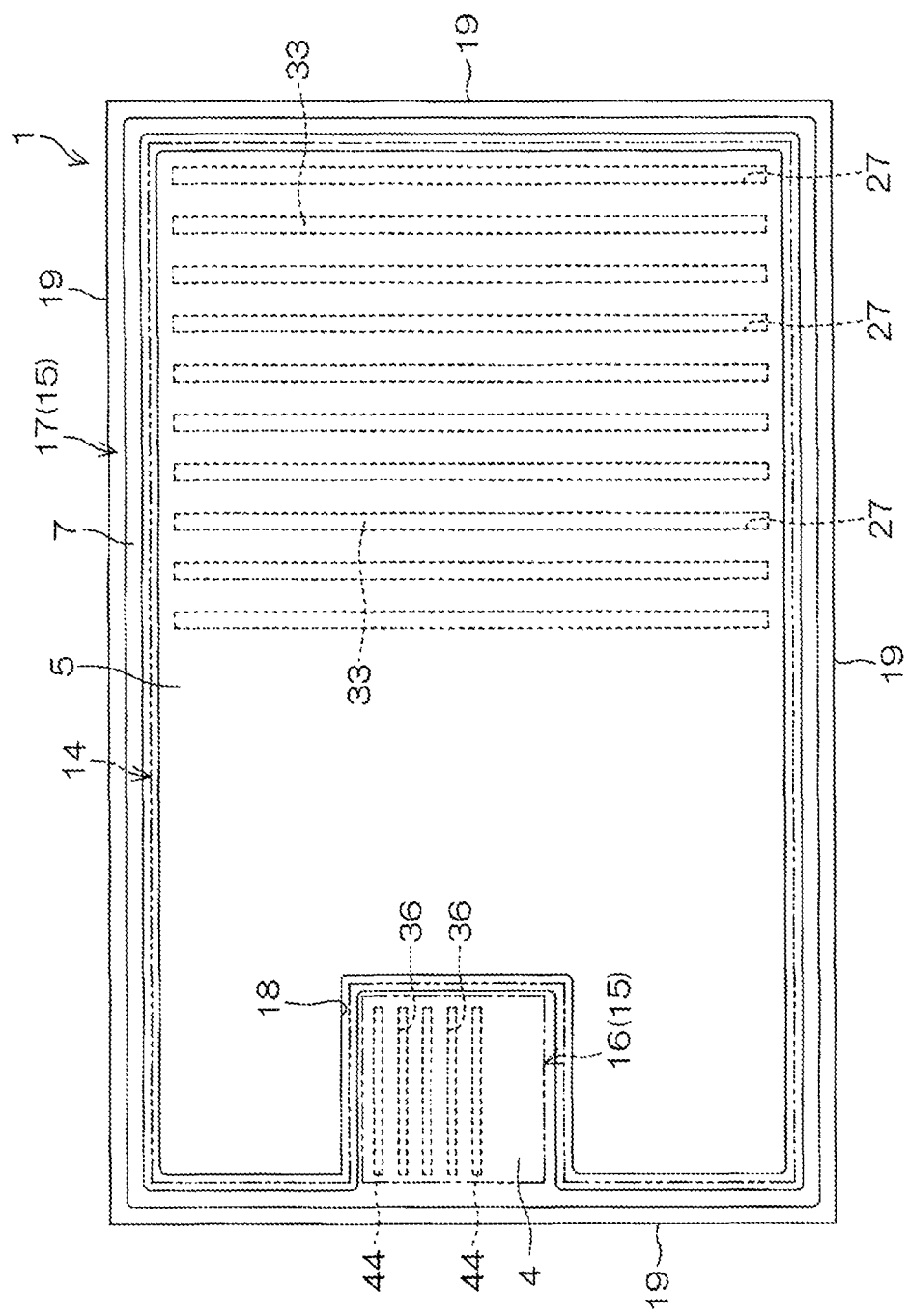
FIG. 14 is a diagram illustrating an exemplary modification of the semiconductor device in FIG. 2.

Furthermore, the capacitor region 16 does not need to be arranged in a corner of the semiconductor device 1, and may be arranged, for example, near a center of one end face 19 of the semiconductor device 1 or may be arranged at the center of the semiconductor device 1 (near an intersection of diagonal lines of the semiconductor device 1 in the plan view (not shown)), as illustrated in FIG. 14.

Figure 15A:
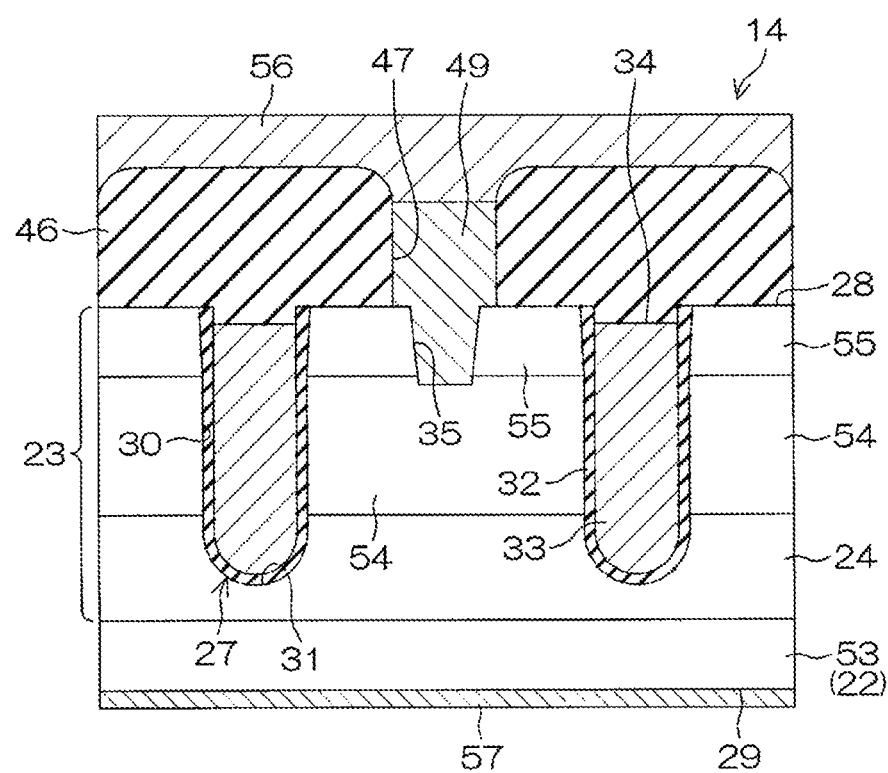
FIGS. 15A and 15B are views illustrating an exemplary modification of the semiconductor device in FIGS. 3A and 3B.
Figure 15B:
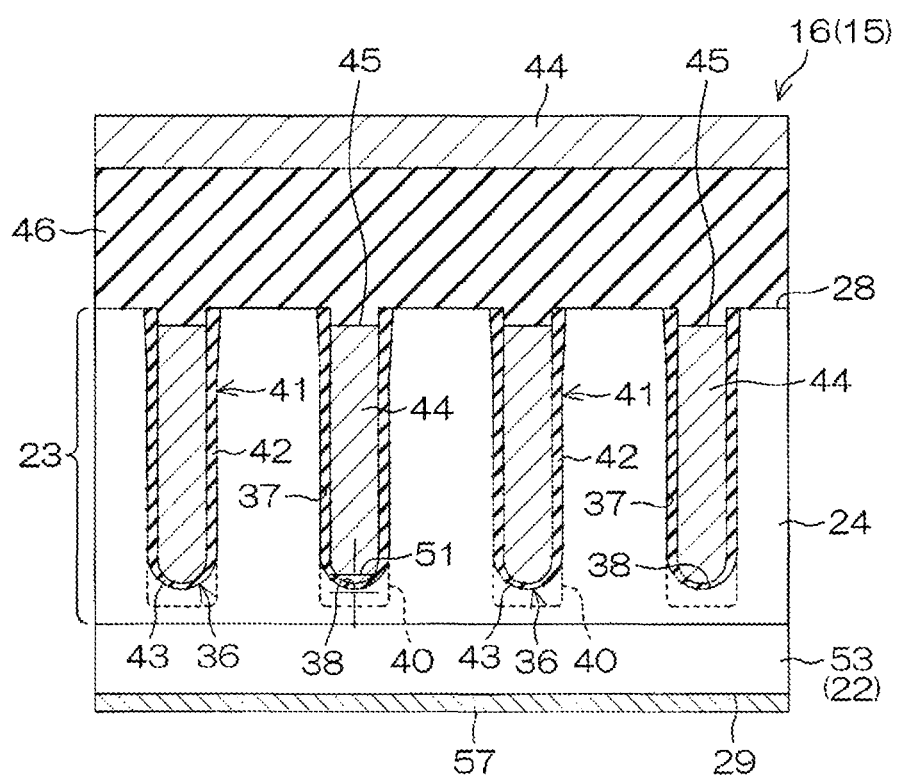

In addition, as illustrated in FIGS. 15A and 15B, the semiconductor device 1 may be configured as a trench gate type IGBT. In this case, the $n^+$-type semiconductor substrate 22, the p-type channel region 25, the $n^+$-type source region 26, the source electrode 5, and the drain electrode 6 may be a $p^+$-type collector region 53, a p-type base region 54, an $n^+$-type emitter region 55, an emitter electrode 56, and a collector electrode 57, respectively.

Moreover, although not shown, the gate trench 27 and the capacitor trench 36 do not need to be formed in the stripe shape. For example, one or both of them may be formed in a lattice shape.

According to the aforementioned embodiments, it is possible to provide a semiconductor device capable of suppressing a reduction in an allowable amount of current flowing in an active region and suppressing generation of noise at the time of turn-off.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a semiconductor layer having a surface and a rear surface;
   an insulating film formed on the surface of the semiconductor layer;
   a first surface electrode layer and a second surface electrode layer formed on the insulating film and arranged at an interval from each other;

a rear electrode layer formed on the rear surface of the semiconductor layer;
an active region set in a region of the surface of the semiconductor layer covered with the first surface electrode layer;
a capacitor region set in a region of the surface of the semiconductor layer covered with the second surface electrode layer;
at least one first trench formed in the active region;
a first insulating film formed on an inner surface of the at least one first trench;
a first embedded electrode embedded in the at least one first trench and configured to control ON and OFF of current flowing between the first surface electrode layer and the rear electrode layer;
at least one second trench formed in the capacitor region;
a second insulating film formed on an inner surface of the at least one second trench; and
a second embedded electrode embedded in the at least one second trench and electrically connected to the first surface electrode layer,
wherein the at least one first trench includes a plurality of first trenches, and the at least one second trench includes a plurality of second trenches,
wherein the first trenches are arranged in a stripe shape at intervals from each other,
wherein the second trenches are arranged in a stripe shape which extends in a direction intersecting a stripe direction of the first trenches, at intervals from each other, and
wherein the second trenches are installed across a boundary between the capacitor region and the active region, and have end portions arranged in the active region.

2. The device of claim 1, wherein the stripe direction of the first trenches and a stripe direction of the second trenches are orthogonal to each other.

3. The device of claim 1, wherein each of the first trenches has a width larger than a width of each of the second trenches.

4. The device of claim 1, wherein a pitch P1 of the plurality of first trenches is larger than a pitch P2 of the plurality of second trenches.

5. The device of claim 1, wherein the second insulating film includes a first portion formed on a side portion of the at least one second trench and a second portion formed on a bottom portion of the at least one second trench, and
wherein the second portion of the second insulating film has a thickness smaller than a thickness of the first portion of the second insulating film.

6. The device of claim 1, wherein the semiconductor layer includes a source region of a first conductivity type, a channel region of a second conductivity type, and a drift region of the first conductivity type sequentially formed along the at least one first trench in a direction from the surface to the rear surface of the semiconductor layer,
wherein the first embedded electrode includes a gate electrode,
wherein the first surface electrode layer includes a source electrode electrically connected to the source region and the channel region via the insulating film,
wherein the second surface electrode layer includes a gate pad electrically connected to the gate electrode, and
wherein the rear electrode layer includes a drain electrode electrically connected to the drift region.

7. The device of claim 6, further comprising a first conductivity type region formed on a bottom portion of the at least one second trench and having an impurity concentration higher than an impurity concentration of the drift region.

8. The device of claim 1, wherein the semiconductor layer includes an emitter region of a first conductive type, a base region of a second conductive type, a drift region of the first conductivity type sequentially formed along the at least one first trench in a direction from the surface to the rear surface of the semiconductor layer and a collector region of a second conductivity type arranged on the rear surface side of the semiconductor layer with respect to the drift region,
wherein the first embedded electrode includes a gate electrode,
wherein the first surface electrode layer includes an emitter electrode electrically connected to the emitter region and the base region via the insulating film,
wherein the second surface electrode layer includes a gate pad electrically connected to the gate electrode, and
wherein the rear electrode layer includes a collector electrode electrically connected to the collector region.

* * * * *